United States Patent
How et al.

(10) Patent No.: US 10,591,544 B2
(45) Date of Patent: Mar. 17, 2020

(54) PROGRAMMABLE INTEGRATED CIRCUITS WITH IN-OPERATION RECONFIGURATION CAPABILITY

(71) Applicant: Altera Corporation, San Jose, CA (US)

(72) Inventors: Dana How, Palo Alto, CA (US); Dinesh Patil, Sunnyvale, CA (US); Arifur Rahman, San Jose, CA (US); Jeffrey Erik Schulz, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 16/043,035

(22) Filed: Jul. 23, 2018

(65) Prior Publication Data

US 2019/0018063 A1    Jan. 17, 2019

Related U.S. Application Data

(63) Continuation of application No. 14/737,246, filed on Jun. 11, 2015, now Pat. No. 10,082,541.

(51) Int. Cl.
*G06F 11/20* (2006.01)
*G06F 11/16* (2006.01)
(Continued)

(52) U.S. Cl.
CPC . *G01R 31/318597* (2013.01); *G01R 31/2896* (2013.01); *G06F 11/00* (2013.01);
(Continued)

(58) Field of Classification Search
None
See application file for complete search history.

(56) References Cited

U.S. PATENT DOCUMENTS

| 5,349,654 A | 9/1994 | Bond et al. |
| 5,532,966 A * | 7/1996 | Poteet ................. G11C 29/785 365/200 |

(Continued)

FOREIGN PATENT DOCUMENTS

| CN | 102508758 A | 6/2012 |
| EP | 2610900 | 7/2013 |

OTHER PUBLICATIONS

Camarota et al., "Applying a redundancy scheme to address post-assembly yield loss in 3D FPGAs", 2014 Symposium on VLSI Technology (VLSI-Technology): Digest of Technical Papers, pp. 1-2.

*Primary Examiner* — Michael Sun
(74) *Attorney, Agent, or Firm* — Treyz Law Group, P.C.; Tianyi He (57) ABSTRACT

Integrated circuit packages with multiple integrated circuit dies are provided. A multichip package may include a master die that is coupled to one or more slave dies via inter-die package interconnects. A mixed (i.e., active and passive) interconnect redundancy scheme may be implemented to help repair potentially faulty interconnects to improve assembly yield. Interconnects that carry normal user signals may be repaired using an active redundancy scheme by selectively switching into use a spare driver block when necessary. On the other hand, interconnects that carry power-on-reset signals, initialization signals, and other critical control signals for synchronizing the operation between the master and slave dies may be supported using a passive redundancy scheme by using two or more duplicate wires for each critical signal.

20 Claims, 7 Drawing Sheets

(51) Int. Cl.
  *G01R 31/3185* (2006.01)
  *G06F 11/18* (2006.01)
  *G06F 11/00* (2006.01)
  *G01R 31/28* (2006.01)
  *H01L 25/065* (2006.01)

(52) U.S. Cl.
  CPC ........ *G06F 11/1625* (2013.01); *G06F 11/186* (2013.01); *G06F 11/2007* (2013.01); *H01L 25/0652* (2013.01); *H01L 2225/06527* (2013.01)

(56) References Cited

U.S. PATENT DOCUMENTS

| | | | |
|---|---|---|---|
| 6,662,133 B2 | 12/2003 | Engel et al. | |
| 6,791,355 B2 | 9/2004 | Vergnes | |
| 6,991,947 B1 | 1/2006 | Gheewala | |
| 7,299,313 B2 | 11/2007 | Gower et al. | |
| 7,409,706 B1* | 8/2008 | O'Rourke | H04L 63/0218 718/105 |
| 7,484,161 B2 | 1/2009 | Dell et al. | |
| 7,539,800 B2 | 5/2009 | Dell et al. | |
| 8,589,769 B2 | 11/2013 | Dell et al. | |
| 9,299,396 B1* | 3/2016 | Lee | G11C 5/14 |
| 9,607,671 B1* | 3/2017 | Lee | G11C 5/14 |
| 9,612,952 B2* | 4/2017 | Hayes | G06F 12/0238 |
| 9,767,892 B1* | 9/2017 | Kumar | G11C 11/419 |
| 2009/0168570 A1* | 7/2009 | Park | G11C 29/846 365/200 |
| 2013/0159587 A1 | 6/2013 | Nygren et al. | |
| 2015/0016194 A1* | 1/2015 | Lim | G11C 29/04 365/189.05 |
| 2015/0023368 A1* | 1/2015 | Connolly | H04L 12/6402 370/420 |
| 2015/0045936 A1* | 2/2015 | Alley | G05B 19/042 700/121 |
| 2018/0181524 A1* | 6/2018 | Schulz | H01L 23/49838 |

* cited by examiner

PROGRAMMABLE INTEGRATED CIRCUITS WITH IN-OPERATION RECONFIGURATION CAPABILITY

This application is a continuation of U.S. patent application Ser. No. 14/737,246, filed Jun. 11, 2015. This application claims the benefit of and claims priority to U.S. patent application Ser. No. 14/737,246, filed Jun. 11, 2015, which is hereby incorporated by reference herein in its entirety.

BACKGROUND

This relates generally to integrated circuit packages, and more particularly, to integrated circuit packages with more than one integrated circuit die. An integrated circuit package typically includes an integrated circuit die and a substrate on which the die is mounted. The die is often coupled to the substrate through bonding wires or solder bumps. Signals from the integrated circuit die may then travel through the bonding wires or solder bumps to the substrate.

As demands on integrated circuit technology continue to outstrip even the gains afforded by ever decreasing device dimensions, more and more applications demand a packaged solution with more integration than possible in one silicon die. In an effort to meet this need, more than one die may be placed within a single integrated circuit package (i.e., a multichip package). As different types of devices cater to different types of applications, more dies may be required in some systems to meet the requirements of high performance applications. Accordingly, to obtain better performance and higher density, an integrated circuit package may include multiple dies arranged laterally along the same plane or may include multiple dies stacked on top of one another.

The multiple dies within a multichip package communicate with one another through inter-die package traces or other conductive paths formed in the package. These package interconnects often exhibit low yield due to manufacturing defects, which reduces the final assembly yield of the package. Several schemes for increasing the final assembly yield have been proposed but they all require use of complex encoding circuits (which takes up valuable die area) and can consume an excessive amount of power (which pushes down circuit performance).

It is within this context that the embodiments described herein arise.

SUMMARY

A multichip integrated circuit package with mixed redundancy scheme for protecting the package from inter-die trace defects is provided. In accordance with an embodiment, an integrated circuit package is provided that includes a first integrated circuit die (e.g., a master die), a second integrated circuit die (e.g., a slave die), first interconnect paths that are coupled between the first and second dies and that are repaired using a first type of redundancy scheme (e.g., an active redundancy scheme), and second interconnect paths that are coupled between the first and second dies and that are supported using a second type of redundancy scheme (e.g., a passive redundancy scheme) that is different than the first type of redundancy scheme. The first and second interconnect paths may be formed entirely within the integrated circuit package.

The active redundancy scheme may be used to switch a defective interconnect path in the first interconnect paths out of use and to switch a spare interconnect path into use. The passive redundancy scheme may use at least a pair of duplicate conductive lines to carry a single-ended signal (e.g., a power-on-reset signal, an initialization signal, a mode synchronization signal, or other control signals for ensuring proper operation between the first and second dies) between the first and second integrated circuit dies. For a differential signal, four wires may be used for the passive redundancy.

The first and second integrated circuit dies may include Joint Test Action Group (JTAG) circuitry for implementing the active redundancy scheme. In particular, a JTAG boundary scan register in each of the first integrated circuit dies may be configured to broadcast and capture predetermined test patterns. The captured test patterns may be analyzed using associated active redundancy control circuitry to identify a defective interconnect path in the first interconnect paths. In response to identifying the defective interconnect path, active redundancy multiplexers in the first and second integrated circuit dies may be configured to bypass the defective interconnect path.

In accordance with another embodiment, the passive redundancy scheme may be implemented using a double bumping scheme where at least a pair of duplicate conductive lines is used to carry each initialization signal between the first and second integrated circuit dies. Initialization signals, power-on-reset signals, and other types of control signals for synchronizing the operation between the first and second signals supported using the passive double bumping scheme can be used to coordinate use of the JTAG boundary scan register and the active redundancy multiplexers prior to enabling the active redundancy scheme.

Further features of the present invention, its nature and various advantages will be more apparent from the accompanying drawings and the following detailed description.

DETAILED DESCRIPTION

Embodiments of the present invention relate to integrated circuits, and more particularly, to integrated circuit packages that include multiple integrated circuit dies.

As integrated circuit fabrication technology scales towards smaller process nodes, it becomes increasingly challenging to design an entire system on a single integrated circuit die (sometimes referred to as a system-on-chip). Designing analog and digital circuitry to support desired performance levels while minimizing leakage and power consumption can be extremely time consuming and costly.

One alternative to single-die packages is an arrangement in which multiple dies are placed within a single package. Such types of packages that contain multiple interconnected dies may sometimes be referred to as systems-in-package (SiPs), multi-chip modules (MCM), or multichip packages. Placing multiple chips (dies) into a single package may allow each die to be implemented using the most appropriate technology process (e.g., a memory chip may be implemented using the 28 nm technology node, whereas the radio-frequency analog chip may be implemented using the 45 nm technology node), may increase the performance of die-to-die interface (e.g., driving signals from one die to another within a single package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multi-chip package is mounted during normal system operation).

Figure 1:
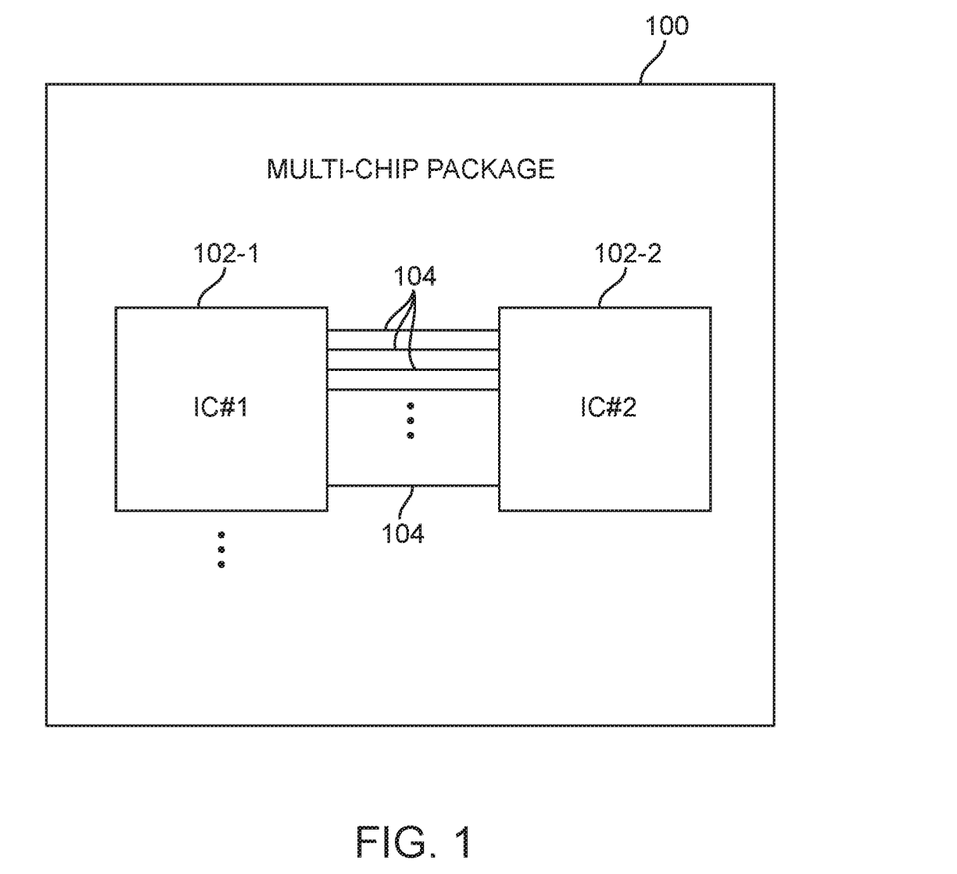
FIG. 1 is a diagram of an illustrative multichip package having a plurality of conductive paths connecting at least two integrated circuit dies in accordance with an embodiment.

In general, it may be desirable to be able to perform testing on one or more dies within a multichip package to ensure that the dies on the multichip package are able to communicate properly with one another. FIG. 1 is a diagram of an illustrative multichip package 100 that includes multiple integrated circuit (IC) dies including at least a first IC die 102-1 and a second IC die 102-2. The integrated circuit dies on package 100 may be any suitable integrated circuit such as programmable logic devices, application specific standard products (ASSPs), and application specific integrated circuits (ASICs). Examples of programmable logic devices include programmable array logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

As shown in FIG. 1, package 100 may include multiple interconnect paths 104 (e.g., conductive signal traces formed on an interposing substrate in the multichip package) that connect die 102-1 to die 102-2. Configured in this way, dies 102-1 and 102-2 may communicate with one another by sending control and data signals via paths 104. The example of FIG. 1 in which multichip package 100 includes two integrated circuit dies is merely illustrative. In general multichip package 100 may include three or more dies, four or more dies, or any desired number of chips stacked laterally with respect to one another or stacked on top of one another.

Due to manufacturing and assembly defects, the inter-die signal paths on a multichip package sometimes suffer from unexpected faults such as open circuit connections or short circuit connections, which reduce the yield of the final package assembly. In accordance with an embodiment, multichip package 100 may be provided with circuitry that is able to help increase the final assembly yield of the package. In particular, multichip package 100 may be provided with a mixed or "hybrid" redundancy scheme that combines a variety of different redundancy techniques that help increase the package's tolerance to potentially broken inter-die connections.

For example, a first portion of the interconnect paths may be supported via a "passive" redundancy scheme that utilizes double-bumped connections to provide an "always functional" control channel, whereas a second portion of the interconnect paths may be supported via an "active" redundancy scheme that utilizes spare circuits that can be selectively switched into use to repair one or more defective connections. The active redundancy scheme associated with the second portion may be initialized via the control channel associated with the first portion. Configured in this way, robust inter-die connections can be provided without substantial area or connection count overhead.

Figure 2:
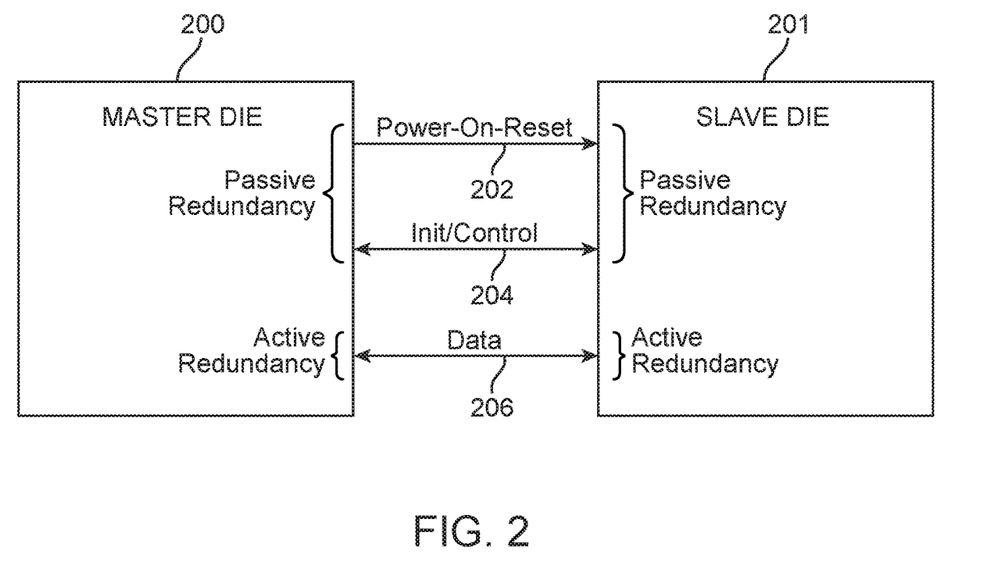
FIG. 2 is a diagram illustrating how a master integrated circuit die may be coupled to a slave integrated circuit die via interconnect paths implemented using a mixed redundancy scheme in accordance with an embodiment.

FIG. 2 is a diagram showing different types of signals that can be conveyed between two different integrated circuit dies on a multichip package. As shown in FIG. 2, a first IC die 200 may be coupled to a second IC die 201. In particular, power-on-reset (POR) signals may flow from die 200 to die 201 via path 202 to simultaneously reset both dies, while initialization and other system mode control signals may be conveyed between the two dies via path 204 to synchronize the two dies. Die 200 that is responsible for generating the POR signals and for distributing the POR signals to other dies in the multichip package may sometimes be referred to as the "master" die, whereas die 201 that receives the POR signals from the master die may be referred to herein as the "slave" die. If desired, other types of supervisory signals may also be passed from the master die to the slave die.

In additional to the reset/synchronization and other supervisory signal described above, user data signals (or "mission-mode" signals) may also be conveyed between dies 200 and 201 via data path 206. Ideally, paths 202, 204, and 206 are all completely functional and can convey signals between the master and slave dies properly without fault. In practice, however, at least one connection in paths 202, 204, and 206 might not be reliable and can be broken due to an unexpected open circuit fault (as an example). In accordance with an embodiment, potential faults in control paths 202 and 204 may be mitigated via a passive redundancy scheme (e.g., via a double bumped wiring scheme that conveys the same signal via a pair of wires instead of only one), whereas potential faults in data path(s) 206 may be fixed using an active redundancy scheme (e.g., by switching a spare input-output driver block into use in response to detecting a broken connection).

Figure 3:
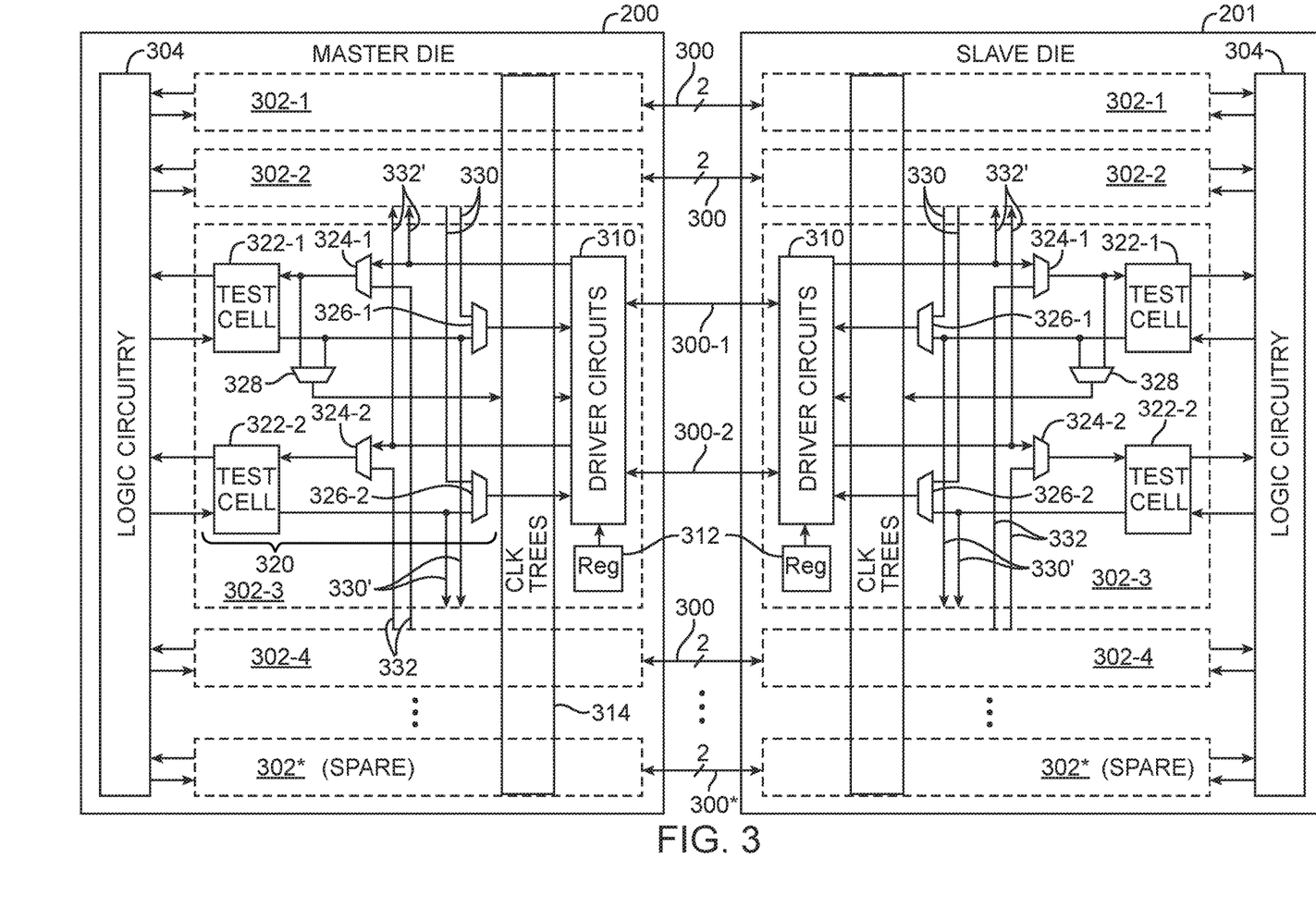
FIG. 3 is a diagram showing how each integrated circuit in a multichip package may have multiple driver blocks including a spare driver block for implementing an active redundancy scheme in accordance with an embodiment.

The active redundancy scheme is illustrated in FIG. 3. As shown in FIG. 3, each of the master and slave dies 200 and 201 may include a plurality of input-output (IO) driver blocks 302, where each driver block 302 can be used to drive a corresponding inter-die lane 300 that is connecting the master die and the slave die. Each of the inter-die lanes 300 in FIG. 3 may include one or more interconnect paths (e.g., one or more interconnect paths 104) in a multichip package, such as package 100. In the example of FIG. 3, each lane 300 includes two wires that can be used to carry one differential signal or two single-ended signals in either direction between the master and slave dies. This is merely illustrative. Each IO driver block 302 may be configured to drive a lane 300 that includes only one wire, two or more wires, three or more wires, four or more wires, eight or more wires, sixteen or more wires, etc.

Each IO driver block 302 may serve as an interface between core on-die logic circuitry 304 and the input/output pins that are coupled to the inter-die lanes 300. Logic circuitry 304 may include sequential and/or combinational logic that can be configured to receive data from the IO pins and to output data to the IO pins via the driver blocks 302. As an example, logic circuitry 304 may be part of programmable "soft" logic circuitry on a programmable integrated circuit such as a programmable logic device (PLD). As another example, logic circuit 304 may be part of non-reconfigurable "hard" logic circuitry on an application-specific integrated circuit (ASIC).

Master die 200 and slave die 201 may each include multiple IO driver blocks 302 (e.g., driver blocks 302-1, 302-2, 302-3, 302-4, etc.) including a spare driver block (or spare "row") 302*. Each of the normal non-spare driver blocks (or normal row) 302 may be coupled to a corresponding lane 300. The spare block 302* may be coupled to a spare lane 300*. When all of the normal lanes 300 are functional, all of the normal driver blocks 302 may be activated while the spare block 302* remains unused (i.e., the spare lane 300* remains idle). When one of the normal lanes 300 is defective, however, one of the normal driver blocks 302 may be deactivated/bypassed by shifting the IO routing at and below the defective lane one block down and switching the spare block 302* into use to take advantage of the spare lane 300*.

For example, consider a scenario in which 50 normal lanes and one spare lane are coupled between the master die 200 and the slave die 201. If all 50 of the normal lanes are in working order, the top 50 corresponding driver blocks 302 will simply route signals straight through to and from logic circuitry 304. If, however, the 17th normal lane is broken (e.g., if at least one of the two wires in the 17th lane has a bad connection or is an open circuit), the first 16 driver blocks 302 will still be configured to route signals straight through while each of the 17th-50th driver blocks will route the signals one block down so that spare driver block 302* will be switched into use. Configured in this way, the 17th broken lane will now be idle; the 18th functional lane will effectively replace the 17th broken lane; the 19th functional lane will effectively replace the 18th lane; and so on. The spare lane 300* will now be configured to serve as the 50th bottommost functional lane. Whether or not the spare driver block 302* is switched into use, however, logic circuitry 304 will only communicate directly with the top 50 normal driver blocks (e.g., the core logic need not send signals to nor receive signals from the spare driver block).

Still referring to FIG. 3, each IO driver block 302 in each IC die 200 and 201 may include driver circuits 310, a driver circuit control register 312, a first input multiplexer (or mux) 324-1, a second input multiplexer 324-2, a first output multiplexer 326-1, a second output multiplexer 326-2, a clock signal routing multiplexer 328, and first and second boundary test cells 322-1 and 322-2. In the example of FIG. 3 where each driver block drives a pair of wires (see, e.g., wires 300-1 and 300-2), driver circuits 310 may include at least a pair of directional drivers. As an example, driver circuits 310 may include two single-ended receivers, a differential receiver, two single-ended output drivers, and/or a differential output driver for supporting transmission of data signals, clock signals, and other types of single-ended or differential control signals. Driver circuit control register 312 may store control bits that set the mode and directionality of driver circuits 310.

Input mux 324-1 may have a first input that is coupled to receive signals from driver circuits 310, a second input that is coupled to path 332 to receive signals from a subsequent driver block, and an output that is coupled to first test cell 322-1. Similarly, input mux 324-2 may have a first input that is coupled to receive signals from driver circuits 310, a second input that is coupled to path 332 to receive signals from the subsequent driver block, and an output that is coupled to second test cell 322-2. Signals received at the first input of muxes 324-1 and 324-2 may also be fed to a preceding driver block via paths 332'.

Output mux 326-1 may have a first input that is coupled to receive signals from first test cell 322-1, a second input coupled to path 330 to receive signals from a preceding driver block, and an output that is coupled to driver circuits 310. Similarly, output mux 326-2 may have a first input that is coupled to receive signals from second test cell 322-2, a second input coupled to path 330 to receive signals from the preceding driver block, and an output that is coupled to driver circuits 310. Signals received at the first input of muxes 326-1 and 326-2 may also be fed to a successive driver block via paths 330'.

Multiplexer 328 may have a first input that is coupled to the output of input mux 324-1, a second input that is coupled to the first input of mux 326-1, and an output that is coupled to a distributed clock tree 314 that is shared among all of the driver blocks 302 (e.g., multiplexer 328 may be configured to route incoming or outgoing clock signals to clock tree 314). Clock tree 314 may be configured to send the clock signals to one or more of the driver circuits 310 to clock the receiver/driver circuits.

Arranged in this way, multiplexers 324-1, 324-2, 326-1, and 326-2 may be configured in a first mode (i.e., by routing signals from the first mux input to the mux output) to route signals straight through between the test cells and the driver circuits or may be configured in a second mode (i.e., by routing signals from the second mux input to the mux output) to route signals to an adjacent driver block (e.g., to a preceding driver block row or a succeeding driver block row).

The test cells 322 in each of the driver blocks 302 may serve as part of a Joint Test Action Group (JTAG) boundary scan chain. During normal (non-testing) operation, the boundary scan chain may be bypassed. During testing, the JTAG boundary scan chain in the master die can be used to force a test pattern to be sent externally to the slave die while the JTAG boundary scan chain in the slave die can be used to observe the corresponding received test pattern to test for certain faults that are caused by manufacturing problems, or vice versa. The use of the boundary scan chain to detect connection faults and the subsequent response of fixing the bad connection by switching into use the spare driver block may be referred to herein as "active" inter-die connection redundancy.

In the example of FIG. 3, the unit of replacement is therefore equal to one lane (i.e., one redundancy region has one spare connection). As described above, each lane may include any suitable number of wires (e.g., at least one wire, at least two wires, three or more wires, ten or more wires, etc.). In accordance with another embodiment, the driver blocks on the master die 200 may be divided into multiple regions or groups, each of which has its own spare IO driver block.

Figure 4:
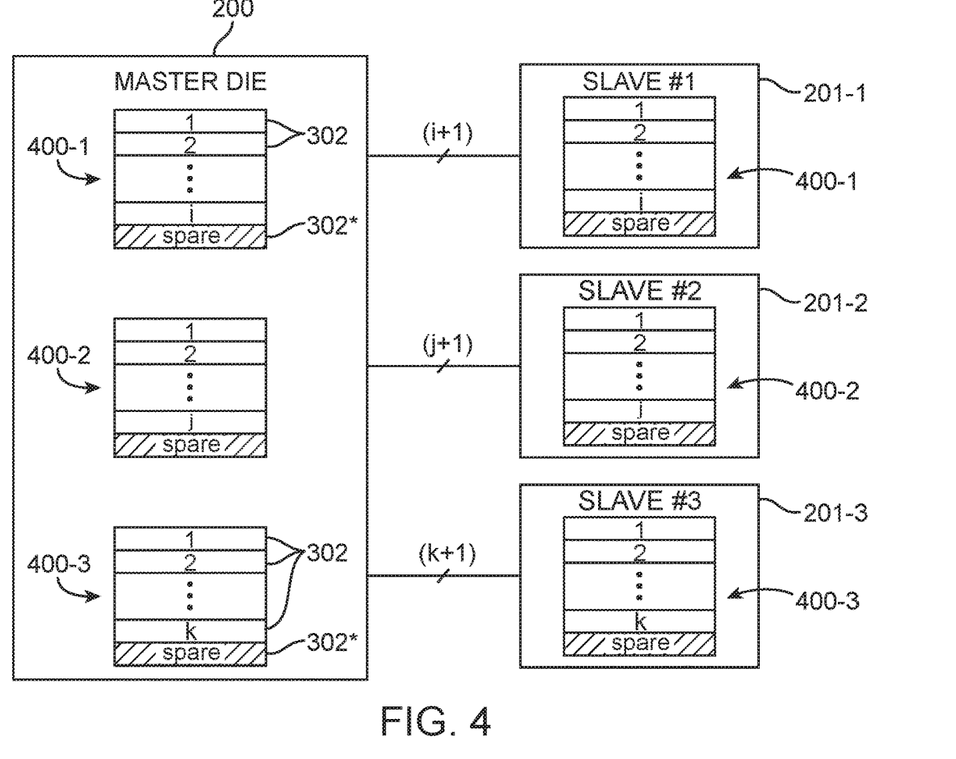
FIG. 4 is a diagram showing how a master die can include multiple driver block regions each of which includes a spare driver block and can be used to communicate with a corresponding one of multiple slave dies in accordance with an embodiment.

FIG. 4 shows one suitable arrangement in which the master die 200 includes three separate active redundancy regions 400 that serve a different respective slave die. In particular, first redundancy region 400-1 having i normal rows 302 and a spare row 302* may be coupled to corresponding redundancy region 400-1 in a first slave die 201-1 via (i+1) lanes. A second redundancy region 400-2 having j normal rows 302 and a spare row 302* may be coupled to corresponding redundancy region 400-2 in a second slave die 201-2 via (j+1) lanes. A third redundancy region 400-3 having k normal rows 302 and a spare row 302* may be coupled to corresponding redundancy region 400-3 in a third slave die 201-3 via (k+1) lanes. The example of FIG. 4 in which the master die includes three redundancy regions for supporting communications with three slave dies is merely illustrative. In general, master die 200 may include any number of redundancy regions for supporting connections with one or more slave dies, with four or more slave dies, with ten or more slave dies, etc.

Figure 5:
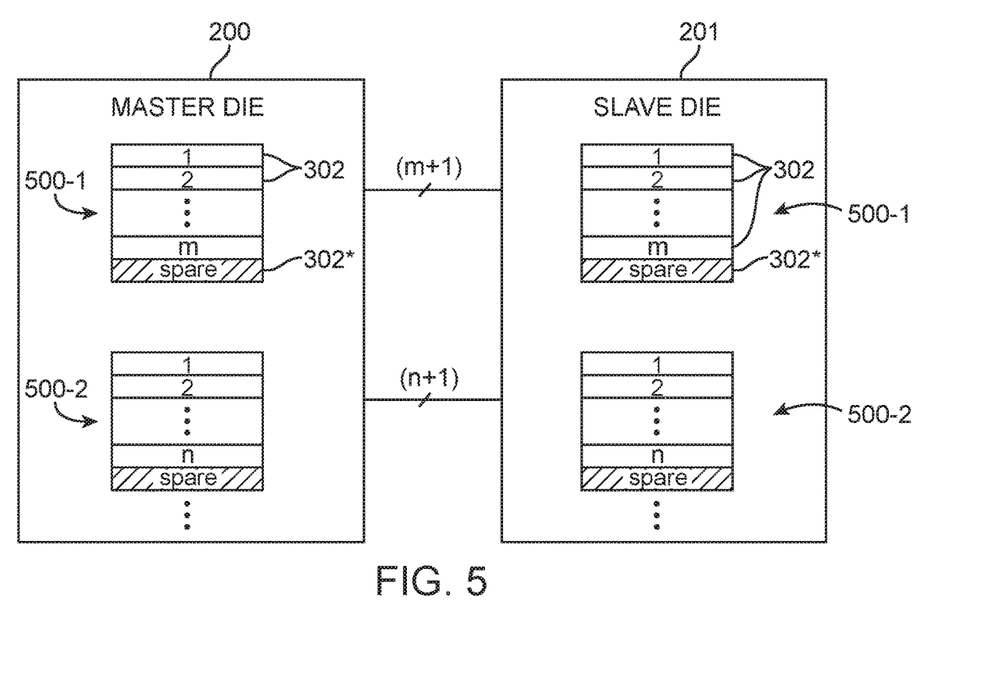
FIG. 5 is a diagram showing how the active redundancy wiring scheme of the type shown in FIG. 3 may be divided into multiple regions in accordance with an embodiment.

FIG. 5 shows another suitable arrangement in which the master die includes multiple redundancy regions for supporting communications with a slave die that includes the same number of redundancy regions as the master die. In particular, a first redundancy region 500-1 having m normal rows 302 and a spare row 302* may be coupled to corresponding redundancy region 500-1 in slave die 201 via (m+1) lanes. A second redundancy region 500-2 having n normal rows 302 and a spare row 302* may be coupled to corresponding redundancy region 500-2 in slave die 201 via (n+1) lanes.

The example of FIG. 5 in which the master die includes two redundancy regions for supporting communications with two redundancy regions in the slave die is merely illustrative. In general, master die 200 and slave die 201 may each include any number of redundancy regions (e.g., one or more active redundancy groups, three or more active redundancy groups, ten or more active redundancy groups, etc.). The embodiments of FIGS. 4 and 5 that include use of multiple active redundancy groups can help increase the number of inter-die connection repairs that can be made. The number of active redundancy regions that is being implemented can therefore be specifically chosen or tuned to match the desired assembly yield requirement, given the yield of the individual connections.

Figure 6:
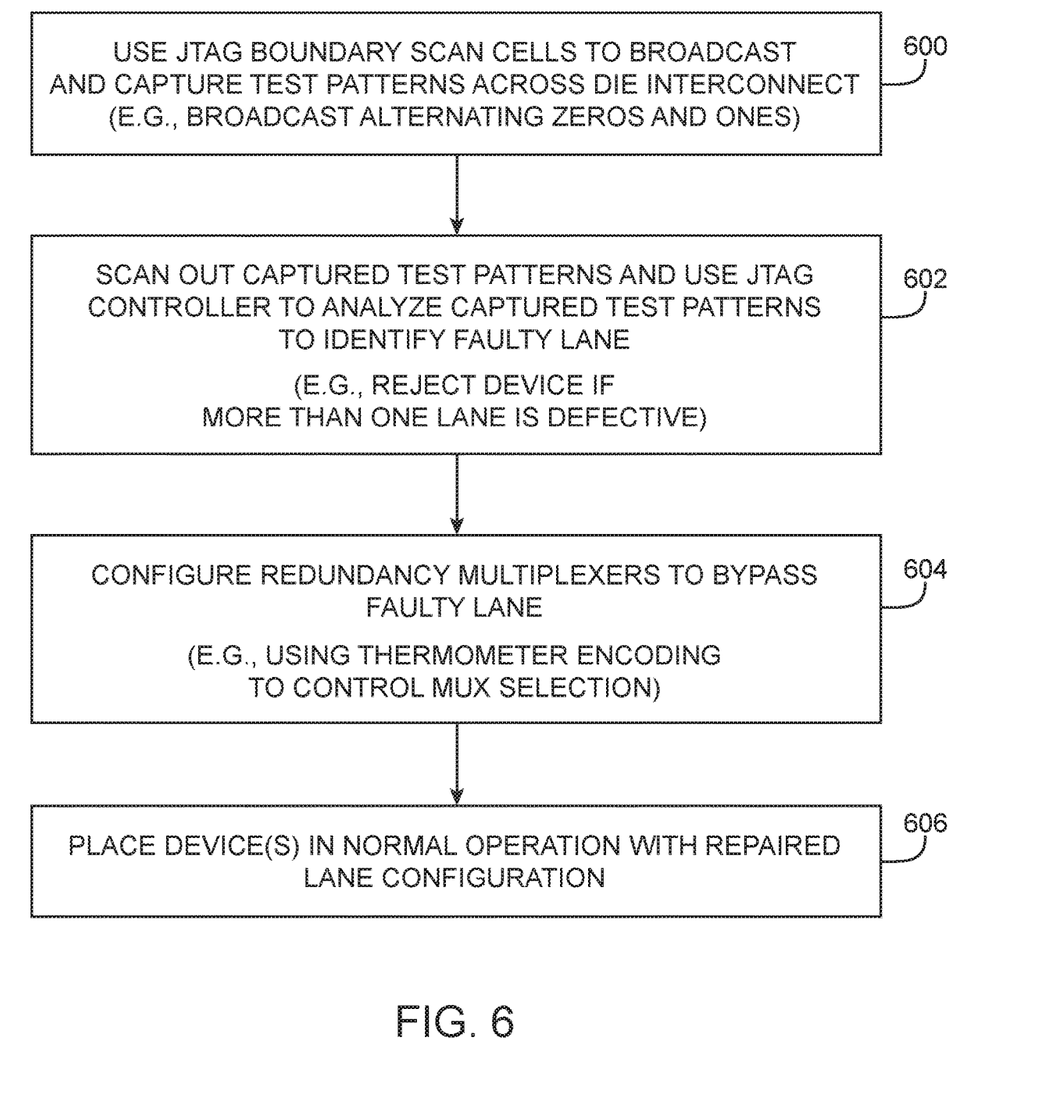
FIG. 6 is a flow chart of illustrative steps involved in operating integrated circuit dies within a multichip package to support active interconnect redundancy in accordance with an embodiment.

FIG. 6 is a flow chart of illustrative steps for operating the circuitry of FIG. 3 to implement the active redundancy scheme (sometimes referred to as an active redundancy "calibration" or "repair" scheme). At step 600, the JTAG boundary scan cells on the master and/or slave dies can be used to broadcast and capture test patterns that are transmitted across the bidirectional inter-die connections. As examples, the test patterns may be alternating zeroes and ones (e.g., 01010101 . . . ), may be a series of ones followed by zeroes (e.g., 11110000 . . . ), may be a series of zeroes followed by ones (e.g., 0001111 . . . ), may be a random sequence of bits (e.g., 1101011100 . . . ), etc.

At step 602, the test pattern that is captured at each of the boundary scan chains may be scanned out. A JTAG controller can then be used to analyze the captured test patterns to determine which lane is broken (if any). The assembly may be rejected if the number of faulty lanes exceeds the maximum number of repairable lanes, in any redundancy region. For example, if the master die is only provided with one repairable region, the assembly may be rejected if more than one lane is defective. However, if the master die is provided with three repairable regions, the assembly may be able to tolerate up to three defective lanes, assuming each defecting is in a separate repairable region.

At step 604, the redundancy multiplexers (e.g., multiplexers 324 and 326 in FIG. 3) may be configured to bypass the faulty lane. Since every multiplexer above the faulty lane should be configured in a pass-through mode whereas every multiplexer at or below the faulty lane should be configured in a "route to an adjacent row" mode to bypass the bad connection, the multiplexers can be controlled using a thermometer code (e.g., a bitstream having a series of zeroes followed by a series of ones or vice versa). Steps 600, 602, and 604 may be executed for each active redundancy region.

Once the faulty lane(s) have been repaired using the active redundancy scheme, the master and slave dies in the multichip package can then be placed in normal operation (step 606).

For the active redundancy scheme to function properly, the JTAG boundary scan test cells 322 and the setting of the multiplexers in each of the driver blocks may have to be coordinated between separate dies so that the proper starting routing configuration can be initialized. In accordance with an embodiment, a "passive" redundancy scheme may be used to convey initialization signals, power-on-reset signals, reference voltage signals, and other control signals between the master and slave die(s). In particular, the passive inter-die redundancy scheme may be a double-bumping routing scheme where each control signal is sent/received twice over a pair of duplicate wires. This double-bumping scheme can quickly consume the number of available IO pins, so in an exemplary embodiment the passive redundancy is only used for important initialization/control signals that are necessary for proper communications between the master die and the slave die(s) before any initialization process could be expected to be complete.

As an example, consider a scenario in which there are 5000 traces between the master die and the slave die. Out of the 5000 traces, maybe only 10-20 traces (e.g., 5-10 signals) utilize the double-bumped passive redundancy wiring scheme. The amount of trace overhead for supporting the passive redundancy is therefore fairly small (less than 0.2% overhead, as an example).

Figure 7:
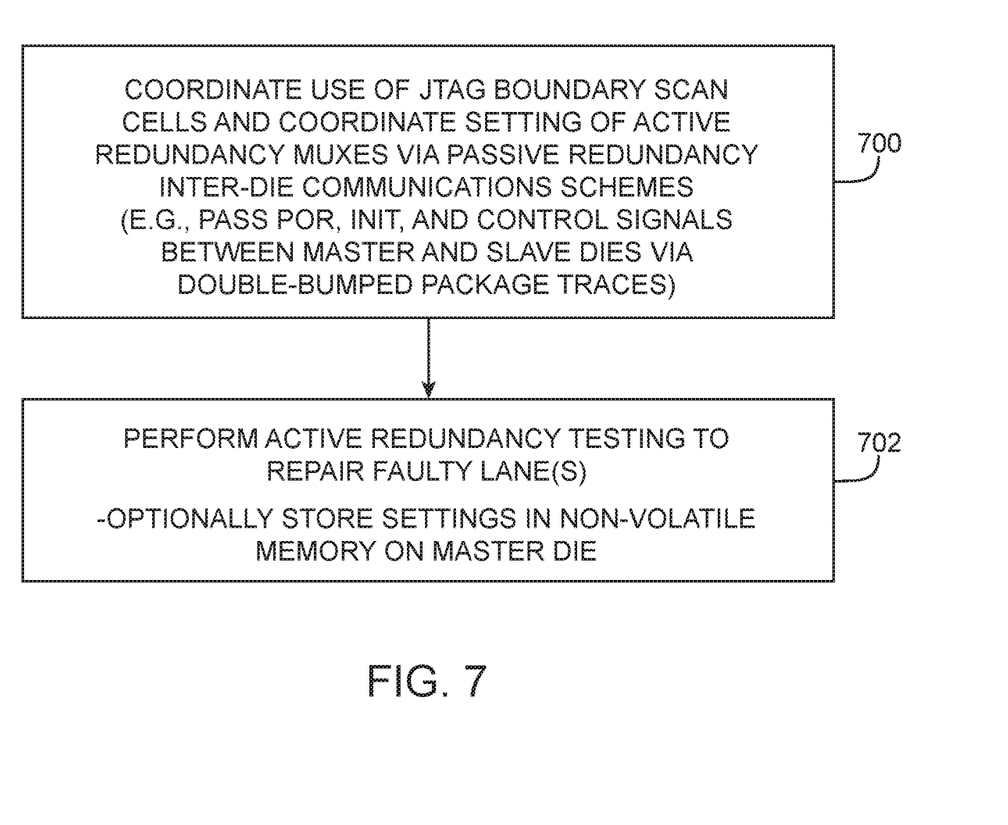
FIG. 7 is a flow chart of illustrative steps for using a passive redundancy scheme to initialize at least some of the driver blocks of FIG. 3 in accordance with an embodiment.

FIG. 7 is a flow chart of illustrative steps for using a passive redundancy scheme to initialize at least some of the driver blocks of FIG. 3. At step 700, the JTAG boundary scan cells and the setting of the active redundancy multiplexers may be coordinated via control signals sent via the passive redundancy wiring scheme. For example, power-on-reset signals, initialization signals, synchronization signals, and other control signals may be passed between the master die and the slave die(s) via the double-bumped package traces. If desired, the double-bumped traces may be shared among two or more redundancy regions and for any suitable number of slave dies.

Once the boundary scan chain and the multiplexers have been properly coordinated, the active redundancy testing can be performed to detect and repair the faulty lane(s), if any (at step 702). At step 702, the steps of FIG. 6 can be performed to selectively switch the spare row into use when needed.

In one suitable embodiment, the steps of FIG. 7 can be performed each time the package is powered up and can therefore be referred to as the "re-diagnose" approach. In another suitable embodiment, the settings obtained at the completion of step 702, which is diagnosed once at the manufacturer, may be stored in non-volatile memory (e.g., fuse, anti-fuses, programmable read-only memory, etc.) on the master die and/or the slave die(s). If the predetermined settings are only stored on the master die, the non-volatile memory may be read from the master die and passed to the slave die(s) during power-up. If the predetermined settings are stored on the master die and on the slave die(s), no initial exchange for repair may be needed. This alternative approach may therefore sometimes be referred to as the "diagnose-once" approach. In yet other suitable embodiments, a non-redundancy approach may be used in which all the redundancy multiplexers are simply configured in the straight pass-through mode. This may be desirable, when first debugging a new die, to avoid the additional complications of properly configuring the redundancy, or it may be desirable if the connection yield improves sufficiently that the redundancy is no longer needed.

Figure 8:
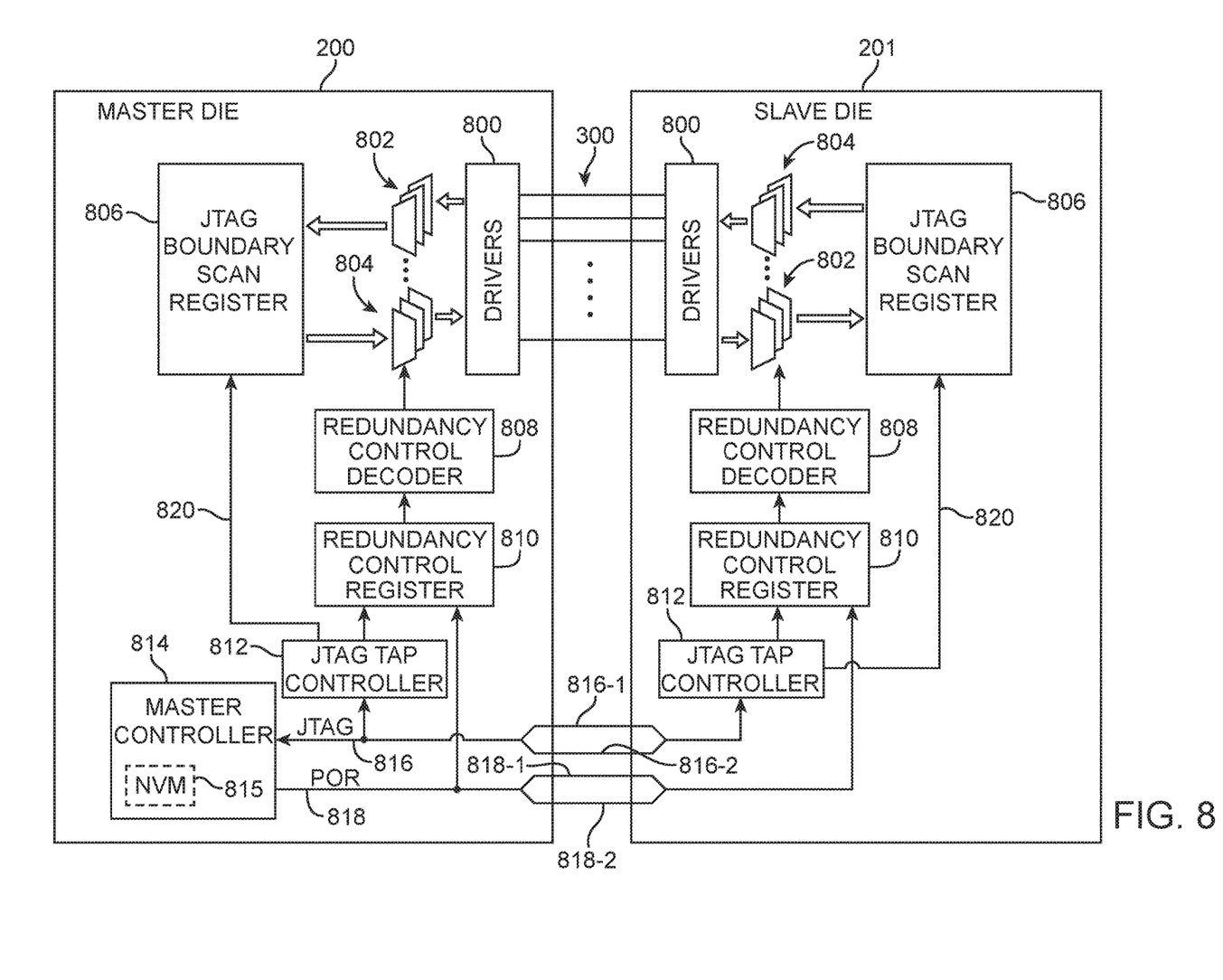
FIG. 8 is a diagram showing how JTAG testing circuitry may be used to support a hybrid interconnect redundancy scheme in a multichip package in accordance with an embodiment.

FIG. 8 is a diagram showing how JTAG testing circuitry may be used to support a hybrid interconnect redundancy scheme that includes both the passive redundancy scheme mixed with the active redundancy scheme. As shown in FIG. 8, each of the master die 200 and the slave die 201 may include drivers 800 (which may represent the plurality driver blocks 302 including the spare row in FIG. 3) that is coupled to JTAG boundary scan chain register 806 via interposing active redundancy multiplexers 802 and 804 (which may be equivalent to muxes 324 and 326, respectively, in FIG. 3).

Multiplexers 802 and 804 may be configured using a decoding circuit such as redundancy control decoder 808. Decoder 808 may provide control bits (e.g., thermometer encoded bits) to configure the multiplexers to route signals straight through or to a preceding/succeeding driver block. Decoder 808 may be controlled by a redundancy control register 810.

Redundancy control register 810 and the JTAG boundary scan register 806 may be coupled to a JTAG tap controller 812. The JTAG tap controller 812 may receive JTAG control signals from a bidirectional JTAG link 816. JTAG link 816 may be coupled to a master test controller 814 that resides in the master die 200. As an example, predetermined settings obtained during active redundancy calibration operations can be stored in non-volatile memory (NVM) 815 within the master controller 814 for the diagnose-once approach described above in connection with FIG. 7.

The master controller 814 may also transmit power-on-reset (POR) signals, initialization signals, mode synchronization signals, and other system control signals to the redundancy control register 810 and any other circuitry that needs to be initialized upon power up in the master die and the slave die via path 818. In particular, the JTAG link 816, path 818, and/or any other interconnects that serve to transfer control signals for setting up testing circuitry in the master die and slave die(s) for proper operation may be provided with the double-bumped passive redundancy.

In the example of FIG. 8, JTAG link 816 (e.g., a multi-wire bus) may be split into two identical inter-die interconnect buses 816-1 and 816-2, whereas POR path 818 may also be split into two duplicate inter-die interconnects 818-1 and 818-2. As described above, more than one redundancy region may share a common JTAG link or POR path (as an example) since each redundancy region needs to be initialized using the same process. In general, the chance for double-bumped connections to be faulty is sufficiently low. The use of double-bumped passive redundancy is, however, merely illustrative. If desired, the passive redundancy scheme may include three or more duplicate wires for each critical signal, four or more duplicate wires for each critical signal, etc.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable array logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An integrated circuit die, comprising:
   a first input-output pin configured to implement a first type of redundancy scheme;
   a second input-output pin; and
   redundancy control circuitry operable to implement a second type of redundancy scheme that is different from the first type of redundancy scheme.

2. The integrated circuit die defined in claim 1, wherein the first type of redundancy scheme comprises a passive redundancy scheme and the second type of redundancy scheme comprises an active redundancy scheme.

3. The integrated circuit die defined in claim 2, wherein the redundancy control circuitry comprises active redundancy control circuitry operable to deactivate a first driver block coupled to the second input-output pin and to activate a second driver block that is different from the first driver block to implement the active redundancy scheme.

4. The integrated circuit die defined in claim 3, wherein the active redundancy control circuitry is operable to route a signal to bypass the first driver block.

5. The integrated circuit die defined in claim 4, wherein the active redundancy control circuitry is operable to route the signal to a third driver block that is different from the first and second driver blocks.

6. The integrated circuit die defined in claim 2, wherein the first input-output pin is configured for carrying a supervisory control signal and the second input-output pin is configured for carrying a data signal.

7. The integrated circuit die defined in claim 2, wherein the passive redundancy scheme supports the use of duplicative conductive lines and the active redundancy scheme supports the use of active switching circuitry.

8. An integrated circuit, comprising:
controller circuitry coupled to a first path configured to transfer a system control signal; and
redundancy control circuitry operable to receive the system control signal and to control signal routing for a driver block coupled to a second path separate from the first path, wherein the first path is configured to support a passive redundancy scheme and the second path is configured to support an active redundancy scheme.

9. The integrated circuit defined in claim 8, wherein the passive redundancy scheme uses duplicative wires to implement the path for transferring the system control signal.

10. The integrated circuit defined in claim 9, wherein the active redundancy scheme uses switching circuitry to switch a spare driver block into use.

11. The integrated circuit defined in claim 8, wherein the system control signal comprises a signal selected from the group consisting of a power-on-reset signal, an initialization signal, or a mode synchronization signal.

12. The integrated circuit defined in claim 8, further comprises:
testing circuitry coupled to the driver block and operable to receive test signals through the second path using the driver block.

13. The integrated circuit defined in claim 12, wherein the redundancy control circuitry is operable to implement the active redundancy scheme based on the test signals.

14. The integrated circuit defined in claim 8, wherein the controller circuitry comprises memory circuitry operable to store predetermined settings for active redundancy calibration operations.

15. The integrated circuit defined in claim 8, wherein the controller circuitry is operable to control the redundancy control circuitry based on the system control signal transferred using the first path that supports the passive redundancy scheme.

16. An integrated circuit package, comprising:
an integrated circuit die;
a first interconnect path coupled to the integrated circuit die and configured to support a first type of redundancy scheme; and
a second interconnect path coupled to the integrated circuit die and configured to support a second type of redundancy scheme that is different from the first type of redundancy scheme.

17. The integrated circuit package defined in claim 16, wherein the first type of redundancy scheme comprises a passive redundancy scheme and the second type of redundancy scheme comprises an active redundancy scheme.

18. The integrated circuit package defined in claim 16, wherein the first interconnect path comprises at least two duplicative signal paths to implement the first type of redundancy scheme.

19. The integrated circuit package defined in claim 16, wherein active switching circuitry controls routing for the second interconnect path to implement the second type of redundancy scheme.

20. The integrated circuit package defined in claim 16, wherein the first interconnect path is configured for a critical control signal and the second interconnect path is configured for a normal user signal.

* * * * *